United States Patent [19]

Sano et al.

[11] Patent Number: 4,996,763
[45] Date of Patent: Mar. 5, 1991

[54] METHOD OF LOCATING WORK IN AUTOMATIC EXPOSING APPARATUS

[75] Inventors: Yukio Sano; Akira Morita; Shigenori Kobayashi, all of Tokyo, Japan

[73] Assignee: ORC Manufacturing Co., Ltd., Tokyo, Japan

[21] Appl. No.: 576,148

[22] Filed: Aug. 30, 1990

Related U.S. Application Data

[63] Continuation of Ser. No. 355,746, May 23, 1989, abandoned.

[30] Foreign Application Priority Data

May 30, 1988 [JP] Japan ................... 63-131954

[51] Int. Cl.$^5$ .............................................. G01R 1/00
[52] U.S. Cl. ........................................ 29/593; 29/407
[58] Field of Search ............... 29/406, 407, 592.1, 29/593, 720, 740, 743, 759; 156/64; 355/73, 312; 356/400, 401; 358/101

[56] References Cited

U.S. PATENT DOCUMENTS

| | | | |
|---|---|---|---|
| 4,057,347 | 11/1977 | Moriyama et al. | 356/401 X |
| 4,153,371 | 5/1979 | Koizuni et al. | 356/401 X |
| 4,232,969 | 11/1980 | Wilczynski | 356/401 |
| 4,761,561 | 8/1988 | Fujiwara et al. | 356/400 X |
| 4,764,791 | 8/1988 | Omata et al. | 355/26 |

FOREIGN PATENT DOCUMENTS 189869 8/1986 European Pat. Off. ............ 356/401
63-46466 2/1988 Japan .

*Primary Examiner*—Joseph M. Gorski
*Assistant Examiner*—Peter Dungba Vo
*Attorney, Agent, or Firm*—Cushman, Darby & Cushman

[57] ABSTRACT

A work to be exposed to light beams in an exposing section is fitted to an alignment table in an automatic aligning apparatus under the effect of suction caused by a suction unit. Then, cameras for optically recognizing alignment marks in the form of images are displaced to positions where the alignment marks can optically be read through wide transparent windows on an alignment table so that positions representative of displacement of the cameras are taken into position representative of the alignment marks on the work within image receiving regions recognizable by the respective cameras. The alignment table is then displaced in such a manner that the positions assumed by the alignment marks on the work are located in correspondence to preset positions in the exposing section. The apparatus is preferably used for automatically aligning a copper-plated laminar plate to be exposed with a mask film when wiring patterns on a printed wiring board are to be exposed.

2 Claims, 2 Drawing Sheets

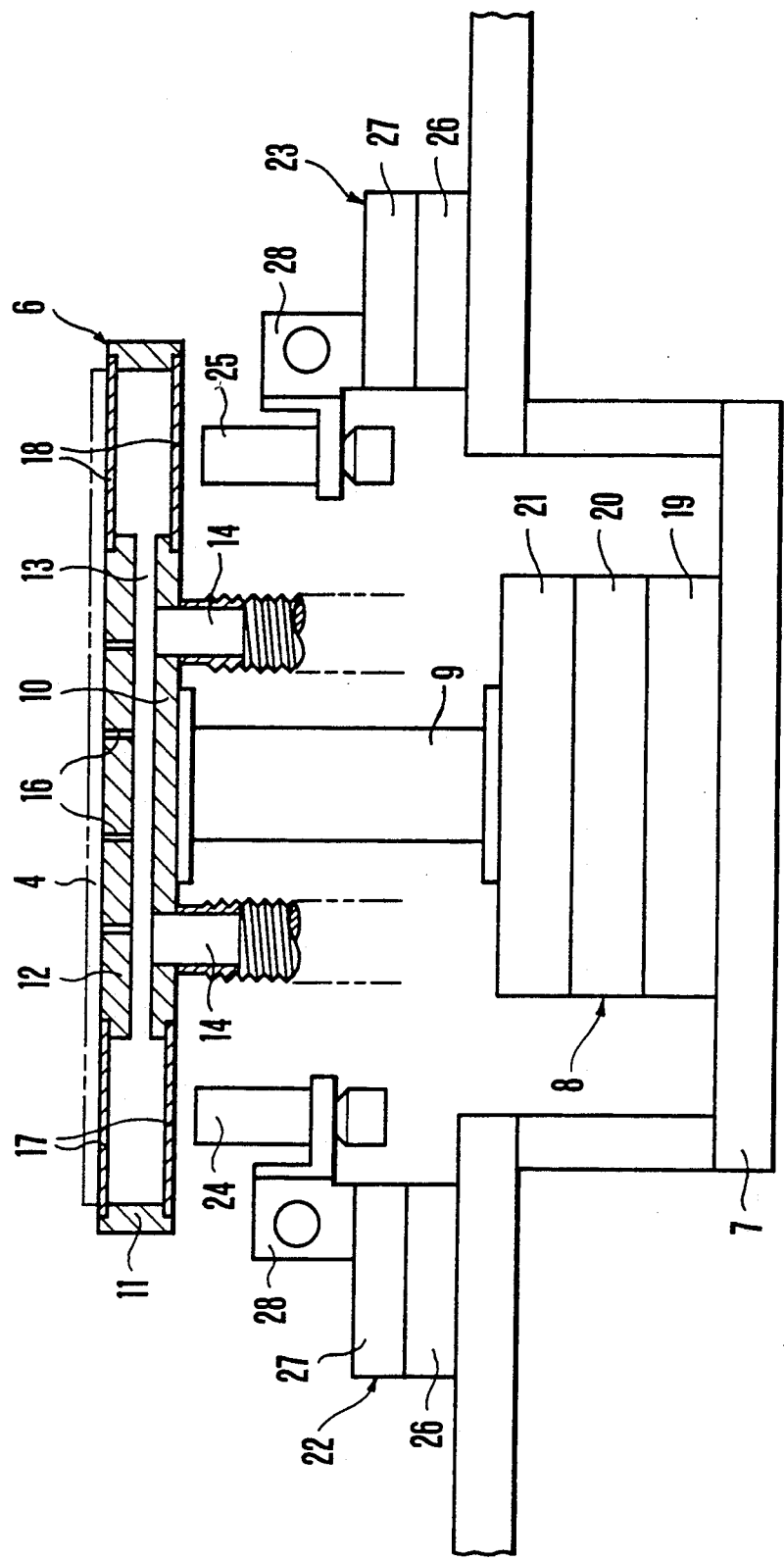

METHOD OF LOCATING WORK IN AUTOMATIC EXPOSING APPARATUS

This is a continuation of application Ser. No. 07/355,746, filed on May 23, 1989, which was abandoned upon the filing hereof 8-30-90.

BACKGROUND OF THE INVENTION

1. Technical Field

The present invention relates to a method of locating the position of a work in an automatic exposing apparatus. More particularly, the present invention is directed to a method of locating the position of a work in an automatic exposing apparatus, which is preferably used for automatically aligning a copper-plated laminar plate to be exposed with a mask film when wiring patterns on a printed wiring board are to be exposed.

2. Description of the Related Art

An automatic exposing apparatus of the type including an automatic aligning unit adapted to perform image recognizing and figure processing is generally classified into one of two types. One type being such that wiring patterns are automatically aligned with a work to be exposed to light beam such as a copper-plated laminar plate in an exposing chamber. The other type being such that a work is previously automatically aligned at a location other than an exposing chamber and thereafter it is introduced into the exposing chamber, as disclosed in the official gazette describing Japanese Laid-Open Patent NO. 46466/1988. The second method is practiced in such a manner that the work is previously formed with alignment marks, the work being fixed to an alignment table at the time of automatic aligning. The alignment marks are optically read by cameras (serving as image receivers) and the alignment table is then displaced such that the alignment marks are located in correspondence to predetermined positions when the work is introduced into the interior of the exposing chamber, whereby the work position is located, i.e., automatic aligning is effected. It has been found that this method is preferably used for carrying out mass production at a high efficiency.

The second method is further classified into two types. The first type being such that, e.g., in a case where wiring patterns on the lower surface of a copper-plated laminar plate serving as a work are exposed to a light beam, cameras for optically reading alignment marks on the copper-plated laminar plate are arranged above the copper-plated laminar plate. The second type being such that the cameras are arranged below it. Arrangement of the cameras above the copper-plated laminar plate provides an advantage in that alignment marks can freely be placed at positions which are convenient for allowing them to be optically read by the cameras irrespective of the position where the wiring patterns to be exposed are located, because the alignment marks are placed on the opposite surface to a surface to be exposed. However, it has a problem in that an error is liable to occur in alignment accuracy, because the alignment marks placed on the opposite surface to the exposure one are utilized for the purpose of locating. Especially, in a case where exposing is repeatedly effected for several times with the same work, alignment accuracy is reduced substantially. In contrast with the foregoing case, arrangement of cameras below the exposure surface of a copper-plated laminar plate leads to other problems. For example, the positions where alignment marks are placed on a work and the positions where the cameras are installed are restricted, because of the necessity for optically reading the alignment marks placed at a position where an error hardly occurs due to warp of the copper-plated laminar plate fitted to an alignment table. A degree of allowance relative to positions of the alignment marks placed on the work and positional changing of the cameras is remarkably reduced, when the shape of a copper-plated laminar plate is changed or wiring patterns to be exposed are changed and consequently, versatility inclusive adaptability to all operative conditions is lost.

SUMMARY OF THE INVENTION

The present invention has been made with the foregoing background in mind and its object resides in providing a method of locating a work in an automatic exposing apparatus which assures that the work can be located without an occurrence of error in alignment accuracy.

Another object of the present invention is to provide a method of locating a work in an automatic exposing apparatus which assures that the positions of alignment marks to be placed on the work and the positions of cameras to be arranged can freely be selected without any restriction.

Another object of the present invention is to provide a method of locating a work in an automatic exposing apparatus which assures that alignment marks can optically be read by cameras with improved alignment accuracy, while warp and deflection of the work are corrected.

To accomplish the above objects, the present invention provides a method of locating the position of a work in an automatic exposing apparatus of the type including an automatic aligning unit. The work is exposed to a light beam in an exposing section and is located in correspondence to a fitting position in the exposing section by optically reading alignment marks previously provided at arbitrary position on the work. The work is subjected to image processing before it is introduced into the exposing section, wherein the method comprises the steps of fitting the work to an alignment table in the automatic aligning unit under the effect of suction caused by a suction unit, displacing cameras for optically recognizing the alignment marks in the form of images to positions where the alignment marks can optically be read through wide transparent windows held on an alignment table, taking positions representative of displacement of the cameras into positions representative of the alignment marks on the work within image receiving regions recognizable by the respective cameras, and displacing the alignment table having the work secured thereto under the effect of suction so that the positions of the alignment marks on the work are located in correspondence to preset positions in the exposing section.

These and other objects, features and advantages of the present invention will become more readily apparent from reading of the following description which has been made with reference to the accompanying drawings.

BRIEF DESCRIPTION OF THE DRAWINGS

The present invention is illustrated in the following drawings in which:

FIG. 2 is a partially sectioned side view schematically illustrating essential components constituting the automatic aligning apparatus.

DESCRIPTION OF THE PREFERRED EMBODIMENT

Figure 1:
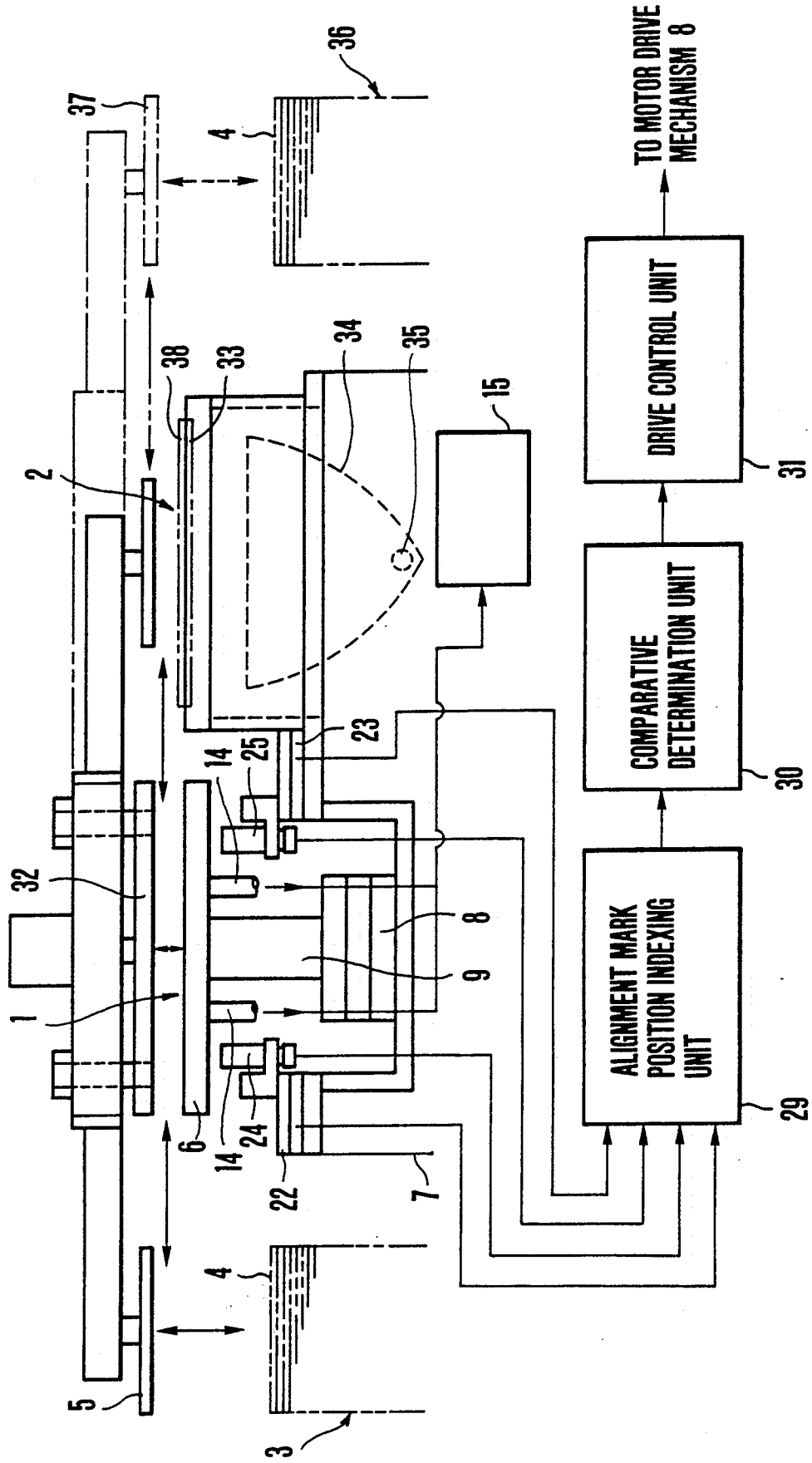
FIG. 1 is a side view schematically illustrating a method of locating a work in an automatic exposing apparatus in accordance with an embodiment of the present invention.

Now, the present invention will be described in detail hereinafter with reference to the accompanying drawings which illustrate a preferred embodiment thereof.

First, description will be made below as to an arrangement for practicing a method of locating a work in accordance with the present invention. FIG. 1 is a side view schematically illustrating an automatic exposing apparatus. In the drawing, reference numeral 1 designates an automatic aligning apparatus and reference numeral 2 designates exposing section. The automatic aligning apparatus 1 is so constructed that a number of unexposed works 4 superposed one above another on an entry stocker 3 are placed one by one on an alignment table 6 by operating an introduction handler 5. As will be apparent from the drawing, the works 4 are carried away by the handler 5 from the uppermost one. The handler 5 is provided with a plurality of suction pads for taking up the works 4 one by one under the effect of suction caused by a suction unit and then bringing one work 4 above the alignment table 6. As a motor drive mechanism 8 is operated, the handler 5 is reciprocably displaced between the stocker 3 and the alignment table 6. Additionally, the handler 5 is vertically displaceable to take and deliver the work 4. The alignment table 6 is mounted on a base 7 via the motor drive mechanism 8 and a support rod 9. As shown in FIG. 2, the alignment table 6 includes a lower plate 10 fixed to the upper end of the support rod 9 and an upper plate 12 spaced away from the lower plate 10 via an annular wall plate 11. The hollow space between the lower plate 10 and the upper plate 12 serves as a suction chamber 13. The suction chamber 13 is communicated with a vacuum pump 15 via suction ducts 14 both of which are connected to the lower plate 10. The upper plate 12 is formed with a number of small holes 16 serving as section holes through which the interior of the suction chamber 13 is communicated with the outside. The suction unit is constituted by the vacuum pump 15, the suction ducts 14, the suction chamber 13 and the suction holes 16. Both the lower plate 10 and the upper plate 12 are fitted with transparent windows 17 and 18 which extend from the annular wall plate 11 toward the support rod 9 to provide an area as wide as possible. The transparent windows 17 and 18 are formed by fitting transparent glass plates, acrylic resin plates or ceramic plates into window openings on the lower plate 10 and the upper plate 12. The transparent windows 17 and 18 are prepared in plural number more than two in correspondence to cameras 24 and 25 which will be described later.

The motor drive mechanism 8 comprises a X-coordinate drive mechanism 19 for displacing the support rod 9, i.e., the alignment table 6 in the traverse direction (hereinafter referred to as a X-coordinate direction), a Y-coordinate drive mechanism 20 for displacing it in the longitudinal direction (hereinafter referred to as a Y-coordinate direction) and a THETA drive mechanism 21 for rotating the alignment table 6 about the support rod 9. As the motor is driven, the X-coordinate drive mechanism 19 moves in the X-coordinate direction relative to the base 7 and the Y-coordinate drive mechanism 20 moves in the Y-coordinate direction relative to the X-coordinate drive mechanism 19. The THETA drive mechanism 21 has a center of rotation which is fixed to the lower end of the support shaft 9 so as to allow it to rotate either in the clockwise direction or in the anticlockwise direction relative to the Y-coordinate drive mechanism 20. Further, the base 7 is provided with cameras 24 and 25 for optically recognizing alignment marks via camera position adjusting mechanisms 22 and 23. A CCD (charge coupled device) type image receiver is utilized for the cameras 24 and 25 so as to make it possible to index in image receiving regions the positions where alignment marks are received. Each of the camera position adjusting mechanisms 22 and 23 comprises a X-coordinate drive mechanism 26 for displacement in the X-coordinate direction, a Y-coordinate drive mechanism 27 for displacement in the Y-coordinate direction and a Z-coordinate drive mechanism 28 for displacement in the direction of height (hereinafter referred to as a Z-coordinate direction). Thus, the cameras 24 and 25 can be located at an arbitrary position below the transparent windows 17 and 18 of the alignment table 6 by actuating the camera position adjusting mechanisms 22 and 23.

As shown in FIG. 1, the automatic aligning apparatus 1 is provided with an alignment mark position indexing unit 29 to which signals indicative of positions occupied by the cameras 24 and 25 from a properly selected original point serving as a reference are fed from the camera position adjusting mechanisms 22 and 23 and moreover to which signals indicative of positions occupied by alignment marks on a work on the alignment table 6 in the image receiving region are fed from the cameras 24 and 25, as will be described later. On receipt of the respective positional signals, the alignment mark position indexing unit 29 calculates the positions occupied by the alignment marks with reference to the original point. Next, a comparative determination unit 30 makes a determination as to whether or not the positions of the alignment marks which have been calculated in the alignment mark indexing unit 29 correspond to those of the alignment marks at the time when a work is set at a predetermined position in the exposing section. Then, the motor drive mechanism 8 is controlled via a drive control unit 31 in order to assume that the positions of the alignment marks which have been calculated in that way correspond to those of the same at that time.

On the other hand, an operator visually recognizes the positions where the cameras 24 and 25 have been displaced and the positions where the alignment marks are received by the cameras 24 and 25 in the image receiving region. Then, by manually actuating the motor drive mechanism 8, he can correspond the positions of the alignment marks to predetermined positions in the exposing section 2 at the time of setting. A traverser 32 for conveying the work 4 after the latter has been located is reciprocably arranged between the alignment table 6 and the exposing section 2. The traverser 32 is provided with a properly determined number of suction pads so that the work 4 on the alignment table 6 is held beneath them under the effect of suction caused by the suction unit. Thus, the traverser 32 can not only reciprocably be displaced between the alignment table 6 and the exposing section 2 but also vertically displaced to take and deliver the work 4 by actuating a drive mechanism (not shown).

The exposing section 2 is constructed in a well known manner and comprises a printing frame glass plate 33 on which a work 4 and a mask film 38 having wiring patterns scribed thereon are immovably placed, a mirror 34 and a lamp 35. It should of course be understood that immovable holding of the work 4 and the mask film 38 on the printing frame glass plate 33 may be achieved in various fashions other than the immovable holding under the effect of suction caused by the suction unit. In addition, a taking-out handler 37 having the same structure as the introduction handler 5 is arranged between the exposing section 2 and a taking-out stocker 36. Specifically, the handler 37 is not only reciprocably displaced between the exposing section 2 and the stocker 36 but also vertically displaced to take and deliver a work by actuating a drive mechanism (not shown), while the work is firmly held by a properly determined number of suction pads under the effect of suction caused by the suction unit.

Next, description will be made below as to a method of locating a work.

First, it is necessary that the mask film 38 having wiring patterns or the like scribed thereon to be exposed in the exposing section 2 is placed at a predetermined position. So as to allow the mask film 38 to be placed at the predetermined position, it is put on the alignment table 6 and it is then brought in tight contact with the alignment table 6 under the effect of suction caused by evacuation through the suction holes 16 using the suction unit. Next, the cameras 24 and 25 are displaced by the camera position adjusting mechanisms 22 and 23 to a position where two or more alignment marks on the mask film 38 can optically be received by the cameras 24 and 25. The alignment marks on the mask film 38 are optically read by the cameras 24 and 25 so that the positions assumed by the alignment marks on the mask film 38 are indexed on the basis of their positions in the image receiving regions of the cameras 24 and 25 and the positions to which the latter have been displaced. Then, the work 4 is located during the subsequent step of exposing with reference to the positions occupied by the alignment marks on the mask film 38. The positions derived from the step of indexing are stored in the comparative determination unit 30. After completion of the step of indexing for the positions of the alignment marks, the mask film 38 is conveyed onto the printing frame glass plate 33 in the exposing section 2 by the traverser 32 so that it is immovably secured to the printing frame glass plate 33 using an adhesive tape or the like means. Consequently, the positions of the alignment marks on the mask film 38 fixed to the printing frame glass plate 33 coincide with those on the mask film 38 as measured on the alignment table 6. It should of course be understood that the alignment marks on the mask film 38 should be provided at positions where no interference takes place with wiring patterns or the like to be exposed to the light beam.

Next, a number of works 4 in the form of copper-plated laminar plates are carried away one by one from the stocker 3 by the handler 5 under the effect of suction to be put on the alignment table 6. Next, the work 4 is firmly placed on the alignment table 6 under the effect of suction caused by evacuation through the suction holes 16 via the suction unit. The cameras 24 and 25 optically read two or more alignment marks on the work 4 and their positions are indexed by the alignment mark position indexing unit 29 so as to make a determination as to whether the indexed positions coincide with the positions representative of the alignment marks on the mask film 38 stored in the comparative determination unit 30. The motor drive mechanism 8 is driven until a coincidence is reached so that the alignment table 6 is displaced in the X-coordinate/Y-coordinate directions as well as turned in the clockwise/anticlockwise directions by a proper amount. Once a coincidence has been reached, the alignment marks on the work 4 placed on the alignment table 6 correspond to the alignment marks on the mask film 38 placed on the printing frame glass plate 33. Next, the traverser 32 takes up the work 4 on the alignment table 6, conveys it to the exposing section 2 and lowers it on the mask film 38 placed on the printing frame glass plate 33 so that it is kept immovable on the mask film 38 by activating the suction unit. Then, the lamp 35 is turned on and thereby wiring patterns on the mask film 38 are printed on the work 4. After completion of the step of exposing, the work 4 is conveyed to the stocker 36 by the handler 37 in which it in turn is stored. Thereafter, the aforementioned operations are repeated.

Since the transparent windows 17 and 18 are designed to have a wide area, the work 4 can optically be read by the cameras 24 and 25 even if it is small in shape. In practice, the positions where alignment marks are located on the work 4 should not be limited only to the peripheral region but they may freely be selected if it is found that exposing is not obstructed. It should be added that alignment marks may be provided not only during the step preceding processing for the work 4, but also after the processing step and just before the exposing step.

The present invention has been described above as to a case where one surface of the work 4 is exposed to a light beam. Alternatively, it may be applicable also to a case where both surfaces of the same are exposed to a light beam as disclosed in an official gazette of Japanese Laid-Open Patent NO. 46466/1988. In the last-mentioned case, as is apparent from the official gazette of Japanese Laid-Open Patent NO. 46466/1988, alignment marks on both mask films superposed one above another are optically read by the cameras 24 and 25 to index their positions. Then, both the mask films are separated from each other in the vertical direction at the exposing section 2 so that a work is inserted into a gap appearing between both the mask films after separation. Therefore, the method of the present invention can be employed as it is.

Besides a copper-plated laminar plate usable for producing a printed wiring board, various articles such as a printing plate employable for screen printing or the like can be utilized as a work 4 to which the method of the present invention is applicable.

As described above, the present invention has provided a method of locating the position of a work in an automatic exposing apparatus, wherein alignment marks on a work are optically read by cameras through transparent windows on an alignment table while the exposing surface side of the work is located as a reference and the work is kept immovable on the alignment table under the effect of suction. Thus, warp and deflection attributable to fluctuation in thickness of the work can be corrected and aligning accuracy can be improved without generation of an error at the time of locating from the presence of warp and deflection. In addition, during a period of exposing, a good exposing state can be maintained with remarkable reduction of incorrect focusing and pitch error. Since the transparent windows through which alignment marks can visually be recognized by the cameras are designed to have a wide area, they can optically be read merely by displacement of the cameras. Further, since alignment marks can optically be read by the cameras irrespective of the position where they are located, they can be located without any positional restriction relative to the work and moreover they can be located at optimum positions in dependence on exposing conditions or the like with a very high degree of freedom, the method of the present invention can be used very conveniently.

What is claimed is:

1. A method of locating a position of a work in an automatic exposing apparatus including an automatic aligning unit in which the work, to be exposed to a light beam in an exposing section, is placed on an alignment table so that alignment marks previously provided at arbitrary positions on the work can be located in correspondence to alignment marks of a mask film previously recorded in an alignment mark position indexing unit and a comparative determination unit, said method comprising the steps of;

fitting and securing the work to the alignment table in the automatic aligning unit under effects of suction caused by a suction unit through small holes provided on the alignment table, displacing cameras in at least one direction along X, Y, and Z-coordinates, thereby optically recognizing the alignment marks on the work in a form of images through wide transparent windows provided at both ends of the alignment table, sending the images of the alignment marks of the work, obtained by the cameras, to the alignment mark position indexing unit and the comparative determination unit thereby recording the images therein, and moving the alignment table along X and Y coordinates or rotating the alignment table in clockwise and counterclockwise directions thereby causing the position of the alignment marks of the work to correspond to the alignment marks of the mask film if the positions of the alignment marks of the work do not correspond to the alignment marks of the mask film as previously recognized and recorded in the alignment mark position indexing unit and comparative determination unit.

2. The method as in claim 1, wherein said displacing cameras step further includes displacing the cameras in any of three orthogonal directions.

* * * * *